(12) United States Patent
Duke

(10) Patent No.: US 7,733,078 B2
(45) Date of Patent: Jun. 8, 2010

(54) SELF-TEST PROBE DESIGN & METHOD FOR NON-CONTACT VOLTAGE DETECTORS

(75) Inventor: Richard A. Duke, Rock Falls, IL (US)

(73) Assignee: Greenlee Textron, Inc., Rockford, IL (US)

( * ) Notice: Subject to any disclaimer, the term of this patent is extended or adjusted under 35 U.S.C. 154(b) by 195 days.

(21) Appl. No.: 11/897,867

(22) Filed: Aug. 31, 2007

(65) Prior Publication Data
US 2008/0054882 A1    Mar. 6, 2008

Related U.S. Application Data

(60) Provisional application No. 60/842,271, filed on Sep. 5, 2006.

(51) Int. Cl.
*G01R 31/02* (2006.01)
(52) U.S. Cl. .................................................. 324/72.5
(58) Field of Classification Search ................. 324/72.5
See application file for complete search history.

(56) References Cited

U.S. PATENT DOCUMENTS

| 4,139,813 | A | * | 2/1979 | Shaffer | 324/457 |
| 4,342,957 | A | * | 8/1982 | Russell | 324/72.5 |
| 5,363,045 | A | | 11/1994 | Martin et al. | |
| 5,877,618 | A | | 3/1999 | Luebke et al. | |
| 5,949,230 | A | | 9/1999 | Kobayashi et al. | |
| 6,470,283 | B1 | * | 10/2002 | Edel | 702/64 |
| 6,844,819 | B2 | * | 1/2005 | Luebke et al. | 340/660 |
| 2002/0167303 | A1 | | 11/2002 | Nakano | |
| 2002/0196146 | A1 | * | 12/2002 | Moore | 340/572.7 |

* cited by examiner

*Primary Examiner*—Jeff Natalini
(74) *Attorney, Agent, or Firm*—Pillsbury Winthrop Shaw Pittman LLP

(57) ABSTRACT

A non-contact voltage detector having a self-test feature is provided. The non-contact voltage detector may include an antenna, a detection circuit and a self-test circuit. The self-test circuit may be configured to send a test signal through a portion of the antenna and to the detection circuit. Alternatively, the self-test circuit may be configured to send a test signal to the detection circuit without sending it through a portion of the antenna.

19 Claims, 2 Drawing Sheets

SELF-TEST PROBE DESIGN & METHOD FOR NON-CONTACT VOLTAGE DETECTORS

RELATED APPLICATIONS

This application claims the benefit of U.S. provisional application No. 60/842,271, filed Sep. 5, 2006.

BACKGROUND OF THE INVENTION

1. Field of the Invention

This invention relates generally to a non-contact voltage detector. More specifically, this invention relates to a non-contact voltage detector having a self-test circuit.

2. Description of Related Art

Non-contact voltage detectors are used in a variety of situations when it is necessary to determine if a line or cable is "live" or "hot" because it is connected to a source of voltage, typically an AC voltage. One such situation is when an electrical worker plans to work on the line and wants to ensure that the line is not energized before the worker touches it and risks electrical injury. Non-contact voltage detectors are well suited to this task because they allow the worker to determine if the line is energized without touching the line so that the worker can obtain the information needed without risking injury.

Conventional non-contact voltage detectors devices work by using an antenna or pickup plate that is metallic to conduct a small capacitively-coupled current signal when it is placed into an alternating electrical field. The antenna is usually covered by plastic or other insulating material, thin and elongated, and located near the tip of the device so that the antenna can fit into tight spaces where the cable may be located. The plastic helps to protect the antenna from being broken and also protects the user from inadvertent contact with live voltage. This portion is often referred to as the probe.

After the worker has identified a particular cable, the worker places the probe next to or in direct contact with the cable. If the cable is energized, the metallic antenna is in the presence of an alternating electrical field. This causes the antenna to induce a capacitively-coupled current signal which is conveyed to a detection circuit. In response, the detection circuit triggers a beeper to sound, an LED to flash, or some other signaling device to activate to alert the user that the cable is energized. If the cable is not energized, no current signal is induced by the antenna and the worker is not alerted by the beeper, LED, or other device. The worker then assumes that it is safe to work on the cable.

The detection circuit, beeper and LED are usually battery powered. It is critical that the batteries provide sufficient power to the detection circuit and signaling devices. If not, the non-contact voltage detector will fail to provide a warning signal to the worker even if the cable is energized. For this reason, some conventional non-contact voltage detectors employ a battery verification self-test circuit which is used to indicate to the worker that the batteries have enough power. For example, when the batteries are sufficiently charged, the battery verification self-test circuit may continuously illuminate an LED, emit a beep sound or flash an LED when the unit is turned on, or periodically flash an LED for the entire time the unit is powered on.

However, while these implementations may safeguard against the possibility of a worker trusting a non-contact voltage detector having batteries that are not providing sufficient power to the detection circuit, they do not verify the integrity of the signal path of the detection circuit and/or the antenna.

Therefore, there is a need for a non-contact voltage detector having a self-test circuit that is configured to verify that a signal sent to the detection circuit can be received and detected by the detection circuit. Additionally, there is a need for a non-contact voltage detector having a self-test circuit that is configured to verify that a signal received by a portion of the antenna will travel through the antenna and to the detection circuit where it will be received and detected.

SUMMARY OF THE INVENTION

Embodiments of the invention are directed to a non-contact voltage detector comprising a self-test circuit which sends a signal into the detection circuit either at a time selected by the worker, such as when the worker manually activates a switch, or automatically at specified time intervals. In other words, the self-test circuit serves to simulate the condition when the antenna is placed near a live wire. If the signal path in the detection circuit is intact, the signal will be detected and the detection circuit will so indicate to the user by triggering the signaling devices, i.e. an LED and a speaker, that the batteries, detection circuit, and signaling devices are working properly.

Further embodiments of the invention are directed to a non-contact voltage detector having an antenna with a first connection point and a second connection point, a detection circuit connected to the second connection point, and a self-test circuit connected to the first connection point, wherein the self-test circuit sends a signal into the first connection point to verify the integrity of the portion of the antenna between the first and second connection points in addition to the batteries, detection circuit and signaling devices.

BRIEF DESCRIPTION OF THE DRAWINGS

A detailed description of embodiments of the invention will be made with reference to the accompanying drawings, wherein like numerals designate corresponding parts in the figures.

DETAILED DESCRIPTION

In the following description, reference is made to the accompanying drawings, which form a part hereof and which illustrate several embodiments of the present inventions. It is understood that other embodiments may be utilized and structural and operational changes may be made without departing from the scope of the present inventions.

Figure 1:
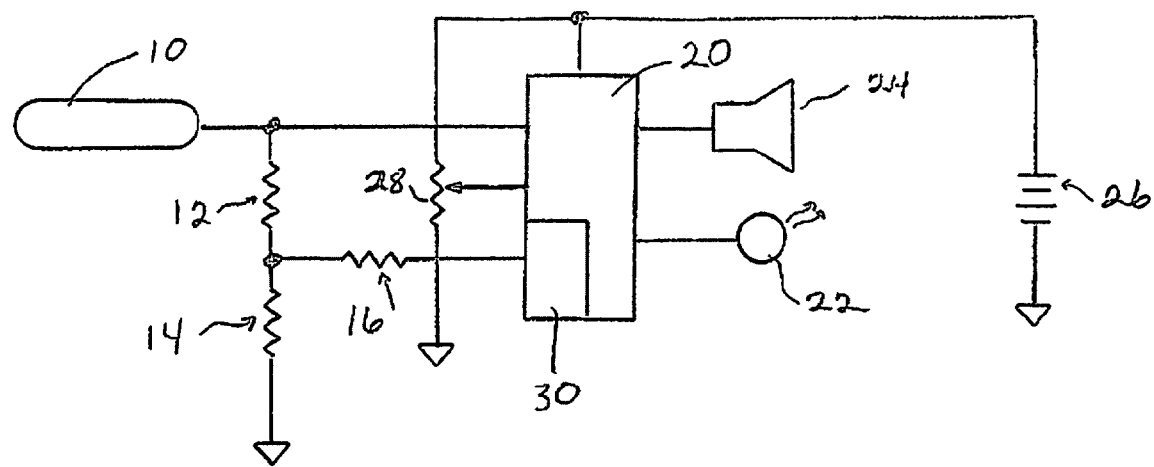
FIG. 1 is a circuit diagram of a first embodiment of the present inventions.

As shown in FIG. 1, an embodiment of the present inventions may include an antenna 10, a resistor 12, a resistor 14, a resistor 16, a variable resistor 28, a detection circuit 20, a self-test circuit 30, an LED 22, a speaker 24 and a power supply 26, e.g., a battery.

The antenna 10 may be connected to the detection circuit 20. The resistor 12 may be connected to the node between the antenna and the detection circuit 20. The resistor 14 may be connected to the resistor 12 and to ground. The resistor 16 may be connected to the node between the resistor 12 and the resistor 14, and to the self-test circuit 30. The detection circuit 20 may be coupled to, or integral with, the self-test circuit 30.

The detection circuit 20 may be any suitable detection circuit. Typical detection circuits include those described, for example, in U.S. Pat. No. 5,877,618 and U.S. Pat. No. 5,363,045, the entire disclosures of which are incorporated herein by reference. The detection circuit may, for example, include an integrated circuit and/or a microprocessor. Although the circuits described in the above identified patents perform the detecting and alerting functions, other circuits may be utilized.

The self-test circuit 30 may include a switch configured to selectively couple the power supply 26 to the resistor 16. In other words, the switch may alternately couple the resistor 16 to the positive terminal of the power supply 26 or to ground. As explained in further detail below, the self-test circuit may be configured to send test signals periodically. In order for the self-test circuit 30 to send test signals periodically, the self-test circuit 30 may include a capacitor. Preferably, the self-test circuit 30 is configured to send test signals having a frequency that falls within the specification range of the detection circuit 20, i.e., 50-60 Hz.

In embodiments, the unit may include components enabling a user to change the sensitivity of the detection circuit 20 and/or the amplitude of the test signal sent by the self-test circuit 30. For example, the resistor 12 may be a variable resistor whereby a user can control the sensitivity of the detection circuit. As the resistance increases, the voltage drop across resistor 12 increases and more current flows into the detection circuit, thereby causing the detection circuit to become more sensitive. Likewise, as the resistance decreases, the voltage drop across resistor 12 decreases and less current flows into the detection circuit, thereby causing the detection circuit to become less sensitive.

Similarly, resistor 14 may be a variable resistor whereby a user can control the sensitivity of the detection circuit and the amplitude of the test signal. In addition, resistor 16 may also be a variable resistor whereby a user can control the amplitude of the test signal. For example, increasing the resistance of resistor 14 causes the detection circuit to become more sensitive and the amplitude of the test signal to increase. Likewise, decreasing the resistance of resistor 14 causes the detection circuit to become less sensitive and the amplitude of the test signal to decrease. By contrast, increasing the resistance of resistor 16 decreases the amplitude of the test signal, and decreasing the resistance of resistor 16 increases the amplitude of the test signal.

In embodiments, the configuration of the detection circuit 20 and the self-test circuit 30 may be such that the amplitude of the self test signals is always substantially equal to or less than the signal coupled onto the antenna when said antenna is in proximity to a conductor energized with a voltage at the lower end of the specification range of detection circuit 20.

In embodiments, the unit may include only one user adjustable component, such as the variable resistor 28, so as to allow a user to simultaneously adjust the sensitivity of the detection circuit 20 and the amplitude of the test signals sent by the self-test circuit 30. The configuration of the detection circuit 20, self-test circuit 30 and user adjustable component may be such that the amplitude of the test signals is always substantially equal to or less than the signal coupled onto the antenna when said antenna is in proximity to a conductor energized with a voltage at the lower end of the specification range of the detection circuit 20. For example, when the user adjustable component is set at one end of its adjustment range, the amplitude of the test signals may be substantially equal to the signal coupled onto the antenna while it is in proximity to a conductor energized at 40V, while the lower end of the specification range is at 50 V, and when the user adjustable component is set at the other end of its adjustment range, the amplitude of the test signals may be substantially equal to the signal coupled onto the antenna while it is in proximity to a conductor energized at 65V, while the lower end of the specification range is at 75V.

In embodiments, the sensitivity of the detection circuit 20 may be controlled by a potentiometer which varies the threshold at which the detection circuit 20 detects a signal and triggers the signaling devices 22 and 24. Thus, resistors 12 and 14 may be fixed resistors, and a user may change the sensitivity of the detection circuit 20 by raising or lowering the detection threshold using the potentiometer.

In embodiments, the detection circuit 20, self-test circuit 30, LED 22, speaker 24 and power supply 26 may be housed in a single housing, and the antenna 10 may project from the housing. The entire unit may be handheld. A switch may be implemented to selectively couple and decouple the power supply 26 from the detection circuit 20 and the self-test circuit 30 to enable a user to power the unit on and off.

In operation, a user may use the switch to power the unit on by coupling the power supply 26 to the detection circuit 20 and the self-test circuit 30. In embodiments, the self-test circuit 30 is configured to send a test signal through resistors 16 and 12 and into the detection circuit 20 as soon as the unit is powered on. If the integrity of the signal path through the detection circuit has not been compromised, the batteries are providing sufficient power and the signaling devices are operational, the detection circuit 20 will trigger the speaker 24 and/or the LED 22 to alert the user that the unit is functioning properly. As a result, a user knows whether the detection circuit 20, signaling devices 24 and 22 and power supply 26 are operational as soon as the unit is powered on. In embodiments, the self-test circuit 30 is configured to send additional test signals at periodic intervals during the entire time the unit is powered on. In this way, a user will be able to tell if one or more components start malfunctioning after the unit is powered on. Alternatively, the self-test circuit 30 may include a user controlled switch to enable a user to selectively perform the self-test function, i.e., so a user can determine whether the unit is operational just before testing a cable.

As discussed above, the unit may have circuitry for varying the sensitivity of the detection circuit 20 and/or the amplitude of the test signals sent by the self-test circuit 30. This allows a user to verify not only that the unit is operational, but also to test the sensitivity of the detection circuit 20. For example, the unit may be rated for a specified voltage range, i.e., 50 to 1000 volts. A large self-test signal would confirm that the circuit is working, but would not confirm that the circuit is sensitive enough to detect a signal at the lower end of the specification range, i.e., 50 volts. If a user is able to select the amplitude of the test signals sent by the self-test circuit 30, the user can test whether the detection circuit 20 will detect signals at the lower end of the specification. Further, if a user is able to select the sensitivity of the detection circuit 20, the user can change the specification range.

To determine whether a cable is energized, a user places the antenna near a cable. If the cable is energized, the electrical field surrounding the cable will induce a current signal in the antenna. The current travels down the antenna 10 to the detection circuit 20 where it is amplified and detected by the detection circuit 20. In response, the detection circuit 20 triggers a beeper 24 and/or an LED 22 to alert the user that voltage is present on the cable.

Figure 2:
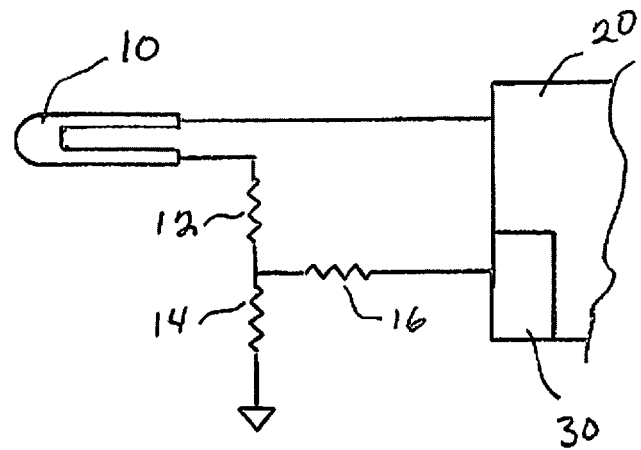
FIG. 2 is a circuit diagram of a second embodiment of the present inventions.

In embodiments, the self-test circuit 30 may be connected to one portion of the antenna 10 and the detection circuit 20 may be connected to a different portion of the antenna 10. For example, as shown in FIG. 2, the antenna may have two ends with a cut-out portion in between them, with the detection circuit 20 being connected to one end of the antenna 10, and the self-test circuit 30 being connected to the other end of antenna 10. Consequently, when the self-test circuit 30 sends a test signal to the detection circuit, the test signal must travel through the portion of the antenna 10 that lies between the portions connected to the self-test circuit 30 and the detection circuit 20, respectively. This will ensure that the tip portion of the antenna 10, and its soldering connections to the detection circuit 20, are intact, and therefore that the antenna 10 will be able to pick up and convey to the detection circuit 20 an electrical signal that is picked up when the antenna is placed near an energized cable. In this way, the self-test circuit can test the integrity of the signal path through not only the detection circuit 20, but also through the antenna 10.

Figure 3:
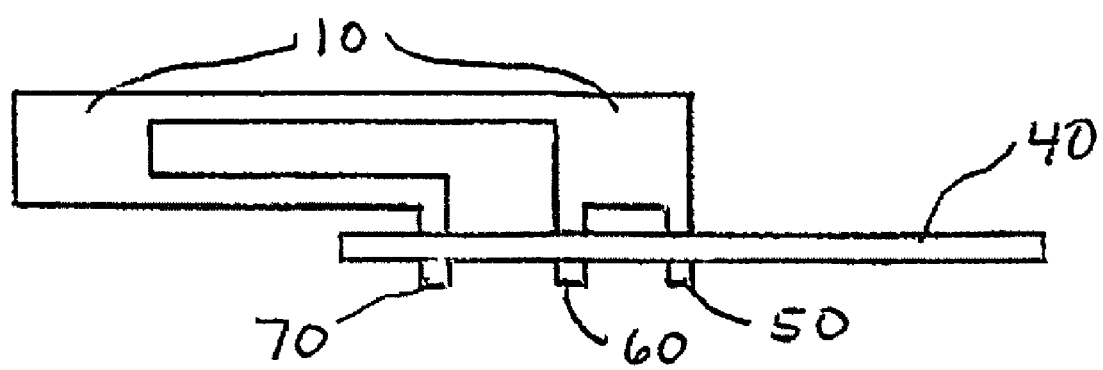
FIG. 3 is a side view of an antenna connected to a printed circuit board in accordance with an embodiment of the present inventions.

As shown in FIG. 3, embodiments of the present inventions may include a printed circuit board 40. The antenna 10 may have a first connecting portion 50, a second connecting portion 60, and a third connecting portion 70. The detection circuit 20 may be connected to the first connecting portion 50, and the self-test circuit 30 may be connected to the third connecting portion 70. The second connecting portion may not be connected to either the detection circuit 20 or the self-test circuit 30, and may instead be used to attach the antenna 10 to the printed circuit board 40 more securely.

In this configuration, the self test circuit 30 sends a test signal through the "tip" portion of the antenna 10 (the portion of the antenna 10 which extends past the printed circuit board). If the tip portion of the antenna 10 is not broken, and if the soldering connections between the antenna 10 and the printed circuit board 40 are intact, the signal will travel from the self-test circuit on the printed circuit board 40 through the first connecting portion, through the tip portion, down the length of the antenna 10, through the first connecting portion, and to the detection circuit 20. In this way, the self-test circuit 30 can verify that a signal received by the tip portion of the antenna 10 will travel through the antenna 10 and to the detection circuit 20 where it will be received and detected.

Alternatively, as described above, the self-test circuit 30 may not be connected to the antenna 10. In this case, the antenna may only have two connecting portions, one for more securely attaching the antenna 10 to the printed circuit board 40, and the other for connecting to the detection circuit 20.

While the description above refers to particular embodiments of the present invention, it will be understood that modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A non-contact voltage detector comprising:
   an antenna;
   a detection circuit coupled to the antenna, the detection circuit being configured to detect an electrical signal received by the antenna; and
   a self-test circuit coupled to the detection circuit, the self-test circuit being configured to send a test signal to the detection circuit, wherein the self-test circuit is connected to a first portion of the antenna, and the detection circuit is connected to a second portion of the antenna and the connection between the self test circuit and the first portion of the antenna is electrically independent from the connection between the detection circuit and the second portion of the antenna.

2. The non-contact voltage detector of claim 1, further comprising a power supply coupled to the detection circuit and the self-test circuit.

3. The non-contact voltage detector of claim 1, further comprising a signaling device, wherein the detection circuit is configured to activate the signaling device when the detection circuit detects an electrical signal.

4. The non-contact voltage detector of claim 3, wherein the signaling device is an LED or a speaker.

5. The non-contact voltage detector of claim 1, wherein the detection circuit is configured to allow a user to control the sensitivity of the detection circuit.

6. The non-contact voltage detector of claim 5, wherein the detection circuit comprises a variable resistor.

7. The non-contact voltage detector of claim 1, wherein the self-test circuit is configured to allow a user to select the amplitude of the test signal.

8. The non-contact voltage detector of claim 7, wherein the self-test circuit includes a variable resistor.

9. The non-contact voltage detector of claim 1, wherein the self-test circuit is configured to send additional test signals to the detection circuit at periodic intervals.

10. "The non-contact voltage detector of claim 1, wherein the third portion of the antenna is used to detect a voltage."

11. A non-contact voltage detector comprising:
    an antenna;
    a signaling device;
    a detection circuit connected to a first portion of the antenna and the signaling device, the detection circuit being configured to activate the signaling device when the detection circuit detects an electrical signal received by the antenna; and
    a self-test circuit connected to a second portion of the antenna, the self-test circuit being configured to send a test signal to the antenna, wherein the connection between the self test circuit and the first portion of the antenna is electrically independent from the connection between the detection circuit and the second portion of the antenna.

12. The non-contact voltage detector of claim 11 wherein the self-test circuit includes a variable resistor enabling a user to select the amplitude of the test signal.

13. The non-contact voltage detector of claim 11 wherein the signaling device is an LED or a speaker.

14. The non-contact voltage detector of claim 11 wherein the detection circuit includes a variable resistor enabling a user to control the sensitivity of the detection circuit.

15. "The non-contact voltage detector of claim 11, wherein the third portion of the antenna is used to detect a voltage."

16. A method of self-testing a non-contact voltage detector in which a first portion of an antenna is coupled to a self-test circuit via a first electrical path, and a second portion of the antenna is coupled to detection circuit via a second electrical path, the first electrical path being independent from the second electrical path the method comprising:
    sending a test signal from the self-test circuit to the detection circuit;
    receiving the test signal at the detection circuit; and detecting the test signal in the detection circuit, wherein when the test signal is sent from the self-test circuit to the detection circuit, the test signal passes through a third portion of the antenna which is between the first portion of the antenna and the second portion of the antenna thereby enabling an integrity evaluation for the antenna.

17. The method according to claim 16, further including: alerting a user when the test signal is detected.

18. The method according to claim 16, further including: selecting the amplitude of the test signal.

19. "The method according to claim 16, wherein the third portion of the antenna is used to detect a voltage."

* * * * *